United States Patent
Hook et al.

(10) Patent No.: US 7,516,426 B2
(45) Date of Patent: Apr. 7, 2009

(54) METHODS OF IMPROVING OPERATIONAL PARAMETERS OF PAIR OF MATCHED TRANSISTORS AND SET OF TRANSISTORS

(75) Inventors: Terence B. Hook, Jericho, VT (US); Jeffrey B. Johnson, Essex Junction, VT (US); Yoo-Mi Lee, Paramus, NJ (US)

(73) Assignee: International Business Machines Corporation, Armonk, NY (US)

( * ) Notice: Subject to any disclaimer, the term of this patent is extended or adjusted under 35 U.S.C. 154(b) by 167 days.

(21) Appl. No.: 11/561,537

(22) Filed: Nov. 20, 2006

(65) Prior Publication Data

US 2008/0116527 A1    May 22, 2008

(51) Int. Cl.
*G06F 17/50* (2006.01)
(52) U.S. Cl. .............................. 716/2; 716/1
(58) Field of Classification Search ...... 716/1, 716/2
See application file for complete search history.

(56) References Cited

U.S. PATENT DOCUMENTS

| 5,546,049 | A * | 8/1996 | Wen et al. ............... 330/277 |
| 6,161,213 | A | 12/2000 | Lofstrom |
| 6,313,511 | B1 | 11/2001 | Noguchi |
| 6,934,669 | B1 | 8/2005 | Suaya et al. |
| 6,978,229 | B1 | 12/2005 | Saxena et al. |
| 7,248,116 | B2 * | 7/2007 | Chiu ........................ 330/253 |
| 2003/0006413 | A1 | 1/2003 | Chawla et al. |
| 2004/0061176 | A1 | 4/2004 | Takafuji et al. |
| 2004/0193390 | A1 | 9/2004 | Drennan et al. |
| 2005/0007160 | A1 * | 1/2005 | Neff ........................ 327/103 |
| 2005/0181587 | A1 | 8/2005 | Duan et al. |
| 2005/0184343 | A1 * | 8/2005 | Thornton et al. .......... 257/351 |
| 2007/0096814 | A1 * | 5/2007 | Chiu ........................ 330/253 |
| 2007/0261011 | A1 * | 11/2007 | Pino et al. .................... 716/4 |
| 2008/0048267 | A1 * | 2/2008 | Richardson et al. ........ 257/365 |

\* cited by examiner

*Primary Examiner*—Jack Chiang
*Assistant Examiner*—Suchin Parihar
(74) *Attorney, Agent, or Firm*—William D. Sabo; Hoffman Warnick LLC

(57) ABSTRACT

Methods of improving operational parameters between at least a pair of matched transistors, and a set of transistors, are disclosed. One embodiment of a method includes a method of improving at least one of a threshold voltage (Vt) mismatch and current drive between at least a pair of matched transistors for analog applications, the method comprising: forming at least a pair of transistors, each with a gate having a plurality of connected fingers; and optimizing a total length of a channel under the plurality of fingers to attain at least one of: a) a reduced threshold voltage mismatch between the at least pair of transistors, and b) increased current drive for a given threshold voltage mismatch, between the at least pair of transistors, each finger having a length less than an overall length of the channel.

4 Claims, 6 Drawing Sheets

METHODS OF IMPROVING OPERATIONAL PARAMETERS OF PAIR OF MATCHED TRANSISTORS AND SET OF TRANSISTORS

BACKGROUND OF THE INVENTION

1. Technical Field

The invention relates generally to integrated circuit (IC) chip fabrication, and more particularly, to methods of improving operational parameters of at least one pair of matched transistors, and a set of transistors.

2. Background Art

In the integrated circuit (IC) chip fabrication industry, designers often make transistors physically larger to improve threshold voltage (Vt) matching characteristics between transistors. Typically, the matching problem is not a geometric problem, but depends on the amount of dopants present in respective channel regions under gates of the transistors, which may vary from transistor to transistor. One technique to ensure threshold voltage matching is to assume that the threshold voltage mismatch is proportional to the square root of area of each of the transistors, assuming that the transistors are intended to be identical. One common way to match threshold voltages between paired transistors is to lengthen a channel of one or more of the transistors to adjust the area of the channel of the transistor. Modern transistors, however, have increasingly small channels and non-uniform lateral doping profiles. For these transistors, the degree of threshold voltage mismatch is not always proportional to the area. That is, with some transistors, e.g., those with a heavy halo (or pocket) implant, the threshold voltage (Vt) mismatch will not improve with channel lengthening as rapidly as predicted by the simple square root of area theory.

FIG. 1 shows a set 90 of matched transistors 100A, 100B that are matched according to embodiments of a conventional method of reducing a threshold voltage (Vt) mismatch between transistors for analog applications, i.e., increased channel length relative to the minimum otherwise required by the technology limitations. As illustrated, transistor 100A includes a conventional transistor including a channel 110 (under gate 116) having contacts 112 to source/drain regions 114. Transistors 100A, 100B each include a single gate 116, e.g., of a polysilicon, extending over channel 110. A threshold voltage (Vt) of transistor 100A is to be substantially matched to that of transistor 100B. Illustrative data is shown in FIG. 2 from a 65 nm low-power CMOS technology. The apparent mismatch slope (i.e., mismatch per square root of device area) increases monotonically at longer channel lengths.

In view of the foregoing, there is a need in the art for another mechanism of improving operational parameters such as threshold voltage mismatch for a set of matched transistors.

SUMMARY OF THE INVENTION

Methods of improving operational parameters between at least a pair of matched transistors, and a set of transistors, are disclosed. One embodiment of a method includes a method of improving at least one of a threshold voltage (Vt) mismatch and current drive between at least a pair of matched transistors for analog applications, the method comprising: forming at least a pair of transistors, each with a gate having a plurality of connected fingers; and optimizing a total length of a channel under the plurality of fingers to attain at least one of: a) a reduced threshold voltage mismatch between the at least pair of transistors, and b) increased current drive for a given threshold voltage mismatch, between the at least pair of transistors, each finger having a length less than an overall length of the channel.

A first aspect of the invention provides a method of improving at least one of a threshold voltage (Vt) mismatch and current drive between at least a pair of matched transistors for analog applications, the method comprising: forming at least a pair of transistors, each with a gate having a plurality of connected fingers; and optimizing a total length of a channel under the plurality of fingers to attain at least one of: a) a reduced threshold voltage mismatch between the at least pair of transistors, and b) increased current drive for a given threshold voltage mismatch, between the at least pair of transistors, each finger having a length less than an overall length of the channel.

A second aspect of the invention provides a method of improving at least one of a total capacitance and a self-gain trans-conductance divided by output conductance value (gm/gds) of a pair of matched transistors for analog applications, the method comprising: forming at least a pair of transistors, each with a gate having a plurality of connected fingers; and optimizing a total length and a total width of a channel under the plurality of fingers to attain at least one of: a) a reduced total capacitance for a given threshold voltage mismatch for the pair of matched transistors, and b) an increased self-gain trans-conductance divided by output conductance value (gm/gds) for the pair of matched transistors, each finger having a length less than an overall length of the channel.

A third aspect of the invention is directed to a set of matched transistors comprising: at least a pair of transistors, each transistor having a gate including a plurality of connected fingers over a channel; and each finger having a length that is less than an overall length of the channel and selected to optimize at least one of: a) a threshold voltage mismatch between the transistors, b) a current drive for a given threshold voltage mismatch between the transistors, c) a total capacitance for a given threshold voltage mismatch for the transistors, and d) a self-gain trans-conductance divided by output conductance value (gm/gds) for the transistors.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

DETAILED DESCRIPTION

Figure 3:
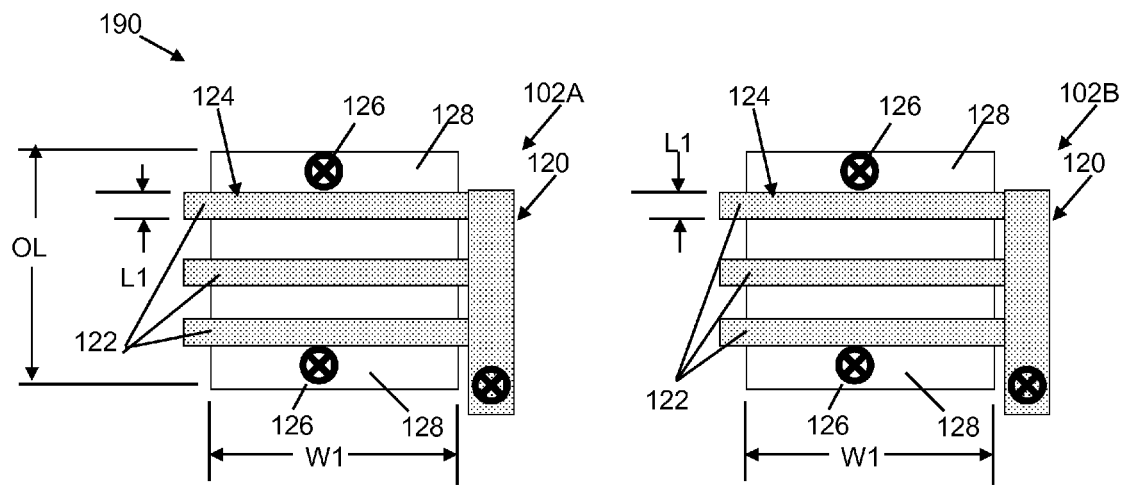
FIG. 3 shows embodiments of a method of improving operational parameters such as a threshold voltage (Vt) mismatch between transistors for analog applications.

FIG. 3 shows a set 190 including at least a pair of matched transistors 102A, 102B that are matched according to embodiments of this invention. Each transistor 102A, 102B, according to embodiments of the method, are formed with a gate 120 having a plurality of connected fingers 122, e.g., of polysilicon or other gate material. Fingers 122 extend over a channel 124 having contacts 126 to source/drain regions 128. Each finger 122 has a length (L1) less than an overall length (OL) of channel 124, i.e., the active region. According to embodiments of the method, a total length of channel 124 under fingers 122 is optimized to improve operation parameters of the matched transistor. As used herein, the total length of channel 124 is defined as the length of the fingers 122 over channel 124. Where fingers 122 all have the same length L1, then the total length is the length L1 times the number of fingers, e.g., 3 L1 for the three finger embodiment of FIG. 3. The optimization may be made by adjusting the size of fingers 122 as they are formed. Matched, as used herein, indicates that a threshold voltage (Vt) of each transistor 102A, 102B is substantially matched. Although set 190 includes only two transistors 102A, 102B, as illustrated, it is understood that any number of paired transistors may be provided and matched.

In one embodiment, the total length of channel 124 is optimized to attain at least one of: a) a reduced threshold voltage mismatch between transistor 102A and transistor 102B, and b) an increased current drive for a given threshold voltage mismatch between transistors 102A, 102B. The optimization may take a variety of forms. According to embodiments of the method, the optimization may include optimizing the total length of channel 124 to obtain an optimal drive current (Ion) for a given structure of one or more of transistors 102A, 102B. Alternatively, in other embodiments, the optimization may include optimizing the total length of channel 124 to obtain an optimal threshold voltage (Vt) mismatch for a given drive current (Ion). In any event, the total channel length (L1 times the number of fingers 122) of channel 124 is at least twice as long as an allowable minimum length of channel 124, i.e., as defined by fabrication ground rules.

In other alternative embodiments, the optimization may include optimizing a total width (W1) of channel 124 under fingers 122 to reduce threshold voltage (Vt) mismatch. A combination of optimization of total length and total width (W1) is also possible.

In addition to the above optimization, embodiments of the method may also improve other operational parameters such as at least one of a total capacitance and a self-gain trans-conductance divided by output conductance value (gm/gds) of a pair of matched transistors for analog applications.

Figure 1:
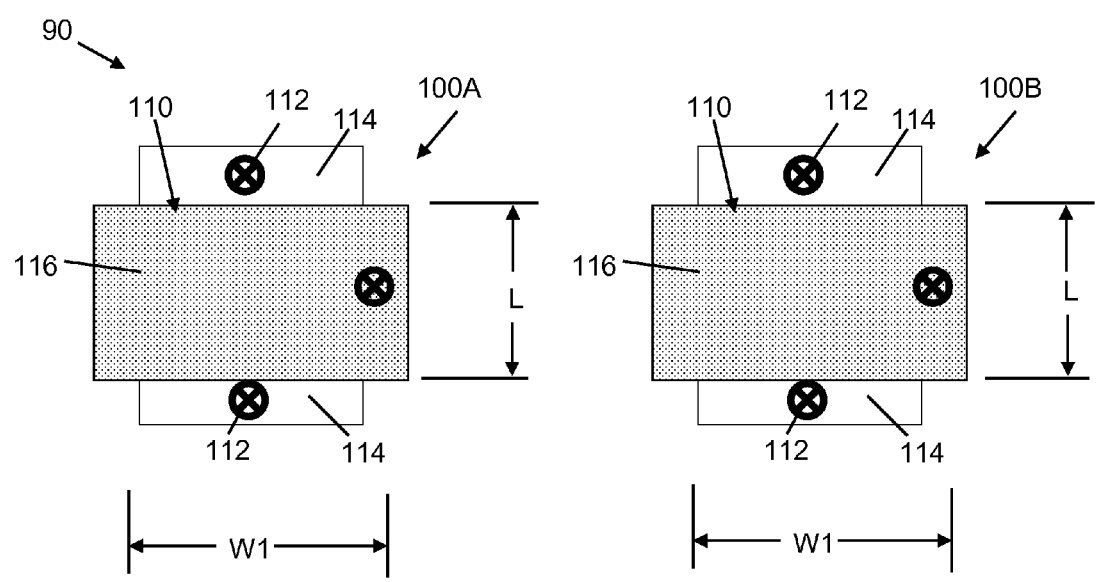
FIG. 1 shows a pair of matched transistors according to the conventional approach.
Figure 2:
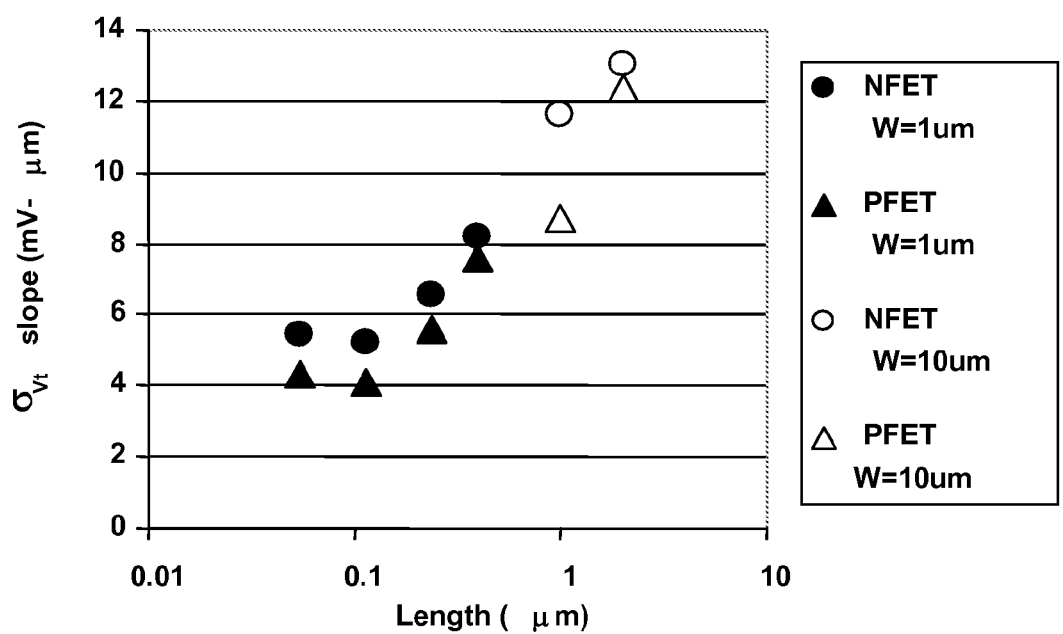
FIG. 2 shows a graph of illustrative data of the non-classic threshold voltage mismatch scaling problem.
Figure 4:
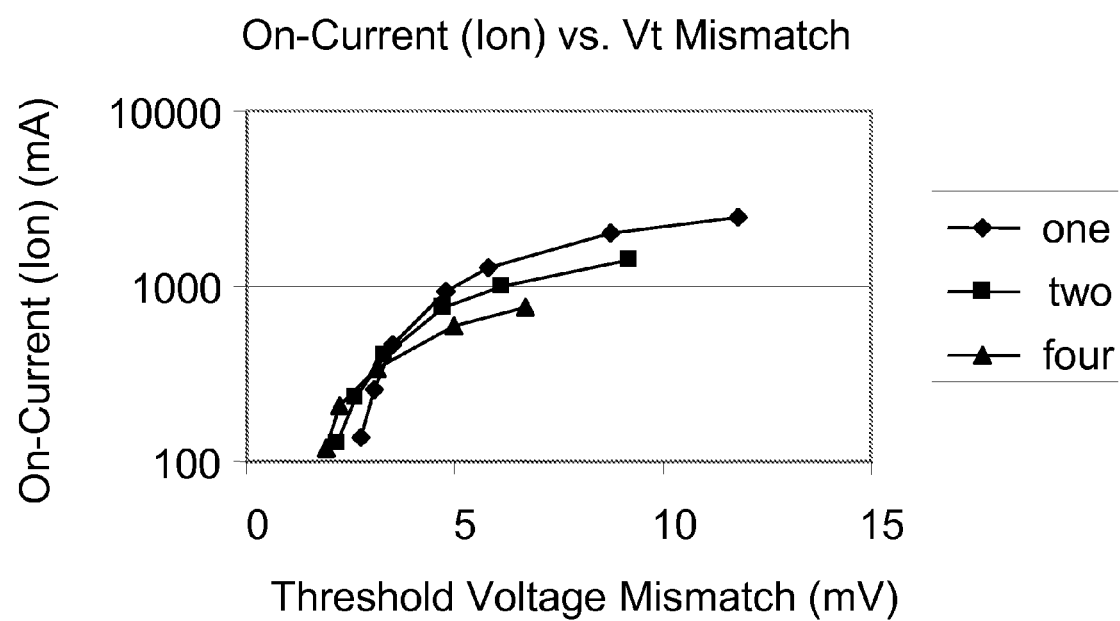
FIG. 4 shows an on-current (Ion) versus threshold voltage (Vt) mismatch graph.

FIG. 4 shows an on-current (Ion) versus threshold voltage (Vt) mismatch graph illustrating some of the benefits of the above-described methods. As the legend states, the diamond indicators are for matched set of transistors having only one fingered gates each (like transistors 100A and 100B in FIG. 1). The square indicators are for matched set of transistors having two fingered gates each, and the triangular indicators are for matched set of transistors having four fingered gates each. As exhibited by the crossing of lines in the graph of FIG. 4, those transistors having a plurality of fingers (e.g., two or four) in their gates exhibit a lower threshold voltage mismatch for the same or better drive current.

Figure 5:
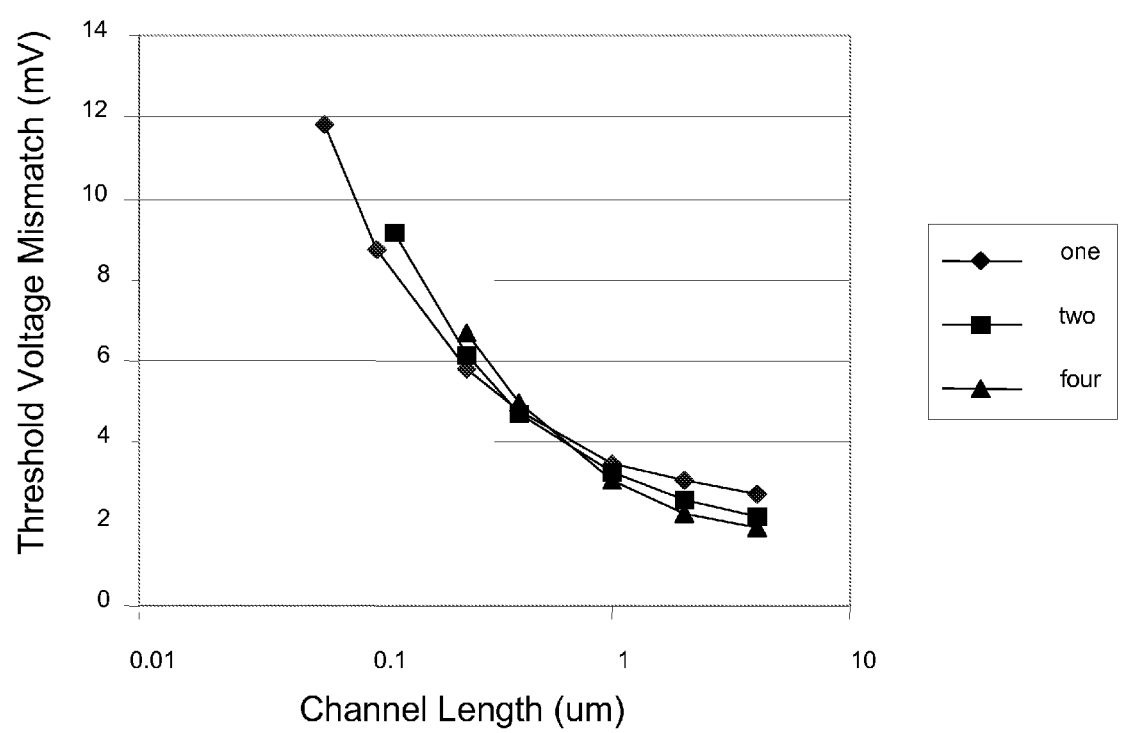
FIG. 5 shows a graph illustrating threshold voltage mismatch as a function of channel length for a conventional one finger gate and for two and four finger gates according to one embodiment of the invention.

FIG. 5 shows a graph illustrating threshold voltage mismatch as a function of total channel length for a conventional one finger gate and for two and four finger gates according to one embodiment of the invention. FIG. 5 shows the total channel length for which the crossing of lines (FIG. 4) occurs in this particular embodiment, which is typical of modern 65 nm CMOS technology. Although the crossover takes place at a channel length well in excess of the minimum enabled in this generation of technology, such long channel lengths are commonly employed in high-accuracy analog designs.

Figure 6:
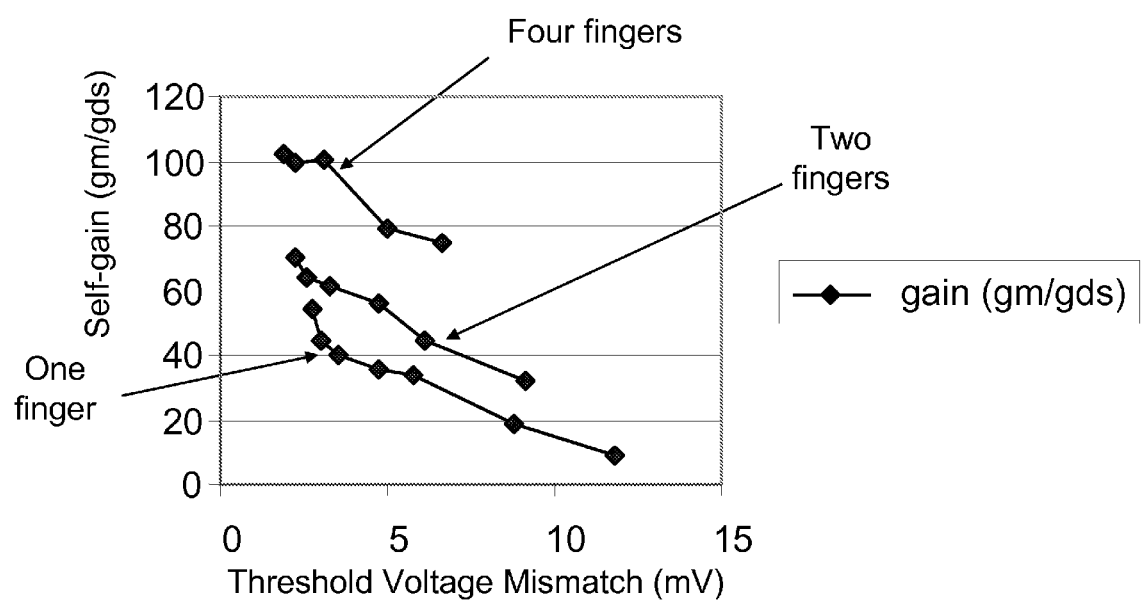
FIG. 6 shows a graph illustrating self-gain trans-conductance divided by output conductance value (gm/gds) of transistors formed according to one embodiment of the invention.

FIG. 6 shows a graph illustrating self-gain trans-conductance divided by output conductance value (gm/gds) (hereinafter "self-gain") of transistors formed according to one embodiment of the invention. FIG. 6 shows that superior self-gain may be obtained for the same threshold voltage mismatch by utilizing the embodiments described herein, for transistors of two or four fingers, in this example.

Another embodiment (FIG. 3) includes a set of matched transistors 190 including at least a pair of transistors 102A, 102B, where each transistor has a gate 120 including a plurality of connected fingers 122 over a channel 124. Each finger 122 having a length (L2) that is less than an overall length (OL) of channel 124 and selected to optimize at least one of: a) a threshold voltage mismatch between the transistors, b) a current drive for a given threshold voltage mismatch between the transistors, c) a total capacitance for a given threshold voltage mismatch for the transistors, and d) a self-gain trans-conductance divided by output conductance value (gm/gds) for the transistors.

The methods and structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of improving a threshold voltage (Vt) mismatch and current drive of at least a pair of matched transistors for analog applications, the method comprising:

forming at least a pair of transistors, each with a gate having a plurality of connected fingers; and optimizing a total length of a channel under the plurality of fingers to attain a reduced threshold voltage mismatch between the at least pair of transistors, and an increased current drive for a given threshold voltage mismatch between the at least pair of transistors, each finger having a length less than an overall length of the channel.

2. The method of claim 1, further comprising optimizing a width of a channel under the plurality of fingers to reduce the threshold voltage mismatch, each finger having a length less than the total length of the channel.

3. A method of improving a total capacitance and a self-gain trans-conductance divided by output conductance value (gm/gds) of a pair of matched transistors for analog applications, the method comprising:
forming at least a pair of transistors, each with a gate having a plurality of connected fingers; and
optimizing a total length and a total width of a channel under the plurality of fingers to attain a reduced total capacitance for a given threshold voltage mismatch for the pair of matched transistors, and an increased self-gain trans-conductance divided by output conductance value (gm/gds) for the pair of matched transistors,
each finger having a length less than an overall length of the channel.

4. A set of matched transistors, comprising:
at least a pair of transistors, each transistor having a gate including a plurality of connected fingers over a channel; and
each finger having a length that is less than an overall length of the channel and selected to optimize a threshold voltage mismatch between the transistors, a current drive for a given threshold voltage mismatch between the transistors, a total capacitance for a given threshold voltage mismatch for the transistors, and a self-gain trans-conductance divided by output conductance value (gm/gds) for the transistors.

* * * * *